(12) United States Patent
Elliott

(10) Patent No.: US 8,869,093 B2
(45) Date of Patent: Oct. 21, 2014

(54) DISPLAYING INTERFACE PROTOCOL ACTIVITY

(75) Inventor: John Elliott, Wilsonville, OR (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/346,683

(22) Filed: Jan. 9, 2012

(65) Prior Publication Data
US 2013/0179855 A1 Jul. 11, 2013

(51) Int. Cl.
*G06F 15/04* (2006.01)
*G06F 17/50* (2006.01)

(52) U.S. Cl.
USPC ........... 716/139; 716/110; 716/111; 716/112; 716/113; 710/100

(58) Field of Classification Search
USPC ............................ 716/110–115, 139; 710/100
See application file for complete search history.

(56) References Cited

U.S. PATENT DOCUMENTS

| 7,440,882 B1 | 10/2008 | McLennan |
| 2007/0005852 A1* | 1/2007 | Armstead et al. ............. 710/100 |

OTHER PUBLICATIONS

"SimPASS PE Simulation Analysis", by LeCroy, @2010.*
LeCroy USB Protocol Suite User Manual Version 4.3', by LeCroy, Sep. 2011.*
"LeCroy USB Protocol Suite User Manual , Version 4.00", by LeCroy, Jul. 2010.*
"Synopsys Announces DesignWare Protocol Analyzer for Verification of SuperSpeed USB 3.0—based Designs—New Verification IP Capability Speeds Time-to-Market by Simplifying Debug of USB 3.0 Interfaces", copyright 2011, downloaded from Internet Dec. 2, 2011.

\* cited by examiner

*Primary Examiner* — Nha Nguyen
(74) *Attorney, Agent, or Firm* — HIPLegal LLP; Judith A. Szepesi

(57) ABSTRACT

Protocol related data generated by a simulation application are captured. One or more protocol objects are displayed in a window on a display device based on the protocol related data. The protocol objects represent events associated with the interface protocol. In at least some embodiments, a location of the protocol objects on the display device is correlated to a simulation time. In at least some embodiments, protocol-related data are grouped according to an abstraction level of the interface protocol, and the protocol objects are displayed on the display device based on grouping. The protocol objects displayed on the display device can be associated with concurrent, interleaved protocol events, or both.

27 Claims, 19 Drawing Sheets
(15 of 19 Drawing Sheet(s) Filed in Color)

Receive a selection of a first protocol object in a first window on a display device, the first protocol object representing events associated with a interface protocol, wherein a first type of protocol objects and a second type of protocol objects are displayed in the first window.
1401

1400

Selecting one or more second protocol objects related to the first protocol object in the first window, the one or more second protocol objects representing events associated with the interface protocol
1402

Receive a request to annotate a message associated with at least one of the events
1403

Display a representation of the message in the first window in response to the receiving the request
1404

Receive a selection of the representation of the message in the first window
1405

Display the message in a pop-up window in response to the selection of the representation of the message in the first window
1406

To 1407

DISPLAYING INTERFACE PROTOCOL ACTIVITY

FIELD

At least some embodiments relate generally to graphical user interfaces, and more particularly, to displaying interface protocol activity.

COPYRIGHT NOTICE

The present description includes material protected by copyrights, such as illustrations of graphical user interface images. The owners of the copyrights, including the assignee, hereby reserve their rights, including copyright, in these materials. The copyright owner has no objection to the facsimile reproduction by anyone of the patent document or the patent disclosure, as it appears in the Patent and Trademark Office file or records, but otherwise reserves all copyrights whatsoever. Copyright Synopsys, Inc. 2011.

BACKGROUND

To design digital circuits (e.g., on the scale of Very Large Scale Integration (VLSI) technology), designers often employ computer-aided techniques. Standard languages such as Hardware Description Languages (HDLs) have been developed to describe digital circuits to aid in the design and simulation of complex digital circuits. Several hardware description languages, such as VHDL and Verilog, have evolved as industry standards. As device technology continues to advance, various product design tools have been developed to adapt HDLs for use with newer devices and design styles.

Generally, a verification application is used to generate tests for a system-on-chip (SoC) verification. The verification application is often used to verify standard bus protocols. As designs incorporate more (and more complex) standard interfaces, the engineers tasked with verifying the behavior of those designs find themselves faced with a barrage of new challenges: they need to understand the detailed operation of the incorporated bus protocols and how those protocols interact with each other and the design. For new interfaces such as USB 3.0 or AMBA 4, or even a well-established interface, this may represent a significant effort. Large SoCs that incorporate multiple protocols exacerbate these issues.

Typically, the scope of recent protocol definitions extends from the lowest physical details, such as the analog behavior exhibited by a physical layer of an Open Systems Interconnection (OSI) model (PHY), up to the edge of (and sometimes into) the software domain. Traditional debug methodologies that utilize waveforms and simulation log files as their source of information are insufficient for understanding the complex hierarchy and inter-relationships of transfers, transactions, data packets and handshaking that are typical of modern protocol specifications.

FIG. 1 shows a traditional graphical user interface 100 having a waveform window 101 and a simulation log file window 102 to analyze design of the integrated circuits. Analysis of high-level protocol behavior in designs that incorporate complex, interleaved bus protocols is difficult using the waveform window 101 and simulation log file 102. Generally, a single waveform shown in window 101 represents bits on a very low (e.g., PHY) level of presentation. It is very difficult and time consuming for a user to understand which portion of the waveform in window 101 correspond to which protocol activity by looking on the log information in window 102. It requires a user to make a lot of notes and calculations about when an activity started and stopped and which activities are going on at the same time. Traditional protocol debug methods that use waveforms and simulation logs are time-consuming and error-prone.

SUMMARY OF THE DESCRIPTION

Methods and apparatuses to provide a graphical user interface to display an interface protocol activity are described. In at least some embodiments, protocol related data generated by a simulation application are captured. In at least some embodiments, the simulation application is executed to design an integrated circuit associated with an interface protocol. One or more protocol objects are displayed in a window on a display device based on the protocol related data. The protocol objects represent events associated with the interface protocol. In at least some embodiments, a location of the protocol objects on the display device is correlated to a simulation time. In at least some embodiments, protocol-related data are grouped according to an abstraction level of the interface protocol, and the protocol objects are displayed on the display device based on grouping. In at least some embodiments, the protocol objects displayed on the display device are associated with concurrent, interleaved protocol events, or both.

Other features will be apparent from the accompanying drawings and from the detailed description which follows.

BRIEF DESCRIPTION OF THE DRAWINGS

The patent or application file contains at least one drawing executed in color. Copies of this patent or patent application publication with color drawings(s) will be provided by the Office upon request and payment of the necessary fee.

Methods and apparatuses described herein are illustrated by way of example and not limitation in the figures of the accompanying drawings in which like references indicate similar elements.

FIG. 8 shows another embodiment of correlating a timeline window and a simulation log file window;

FIG. 11 is a view 1100 similar to FIG. 10, after a representation of the message selected in the annotation window is displayed in a timeline window;

FIGS. 14A and 14B show a flowchart of an exemplary embodiment of a method to display interface protocol activity that indicates concurrent protocol behavior, interleaved protocol behavior, or both and correlates the protocol activity to simulation progress.

DETAILED DESCRIPTION

Figure 1:
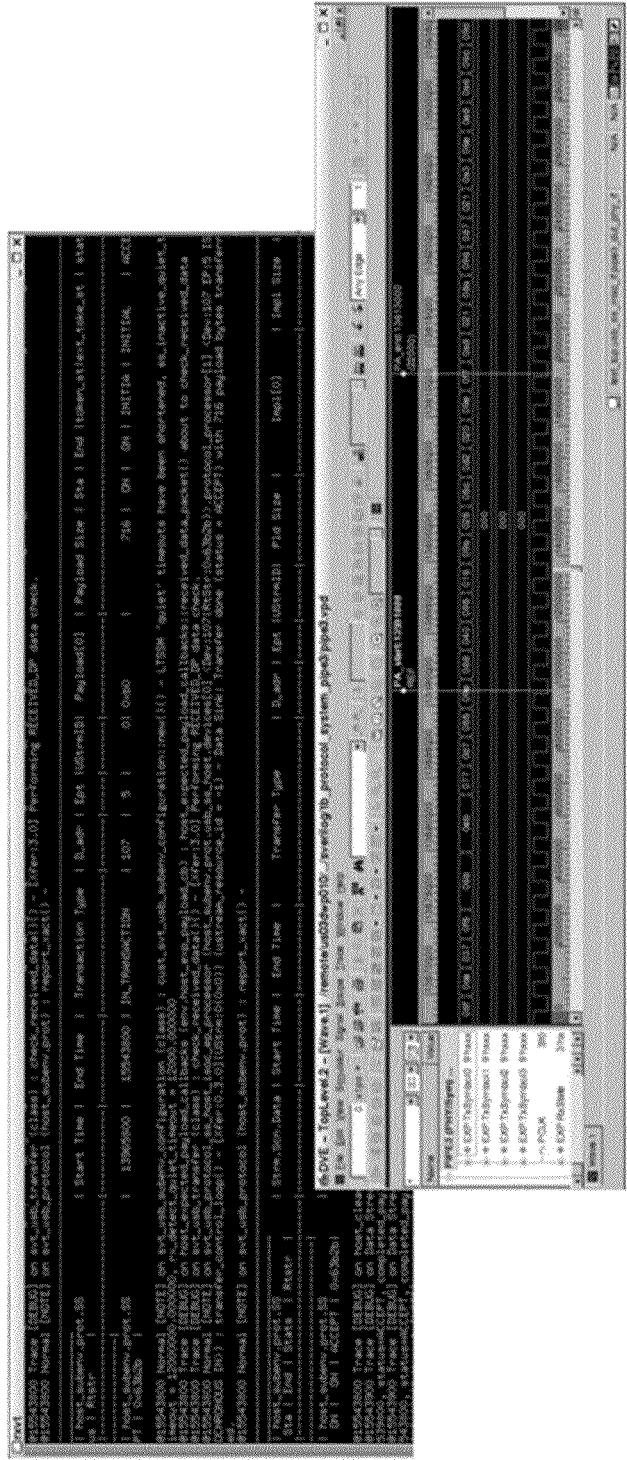
FIG. 1 shows a traditional graphical user interface having a waveform window and a simulation log file window to analyze design of the integrated circuits.

The following description and drawings are illustrative and are not to be construed as limiting. Numerous specific details are described to provide a thorough understanding of the embodiments as described herein. However, in certain instances, well known or conventional details are not described in order to avoid obscuring the description of the embodiments as described herein. References to an embodiment, or to one embodiment in the present disclosure are not necessary to the same embodiment; and, such references mean at least one embodiment.

Methods and apparatuses to display interface protocol activity that highlights concurrent and/or interleaved behavior and correlates activity to simulation progress are described herein. At least one embodiment refers to a protocol analyzer (PA) that is an interactive graphical application designed to accelerate the investigation and understanding of protocol behavior by providing protocol-oriented analysis and debug capabilities in verification environments (applications) for example, Synopsys Verification Intellectual Property (IP).

In at least some embodiments, a protocol analyzer captures protocol-related information in the verification application while the protocol-related information is being processed. By capturing the protocol-related data when it is generated, the protocol analyzer can include the data types of the protocol objects, the relationships between those objects and any errors (i.e. exceptions) that were either purposefully injected into the simulation by the VIP or erroneously generated by the system being tested.

The Protocol Analyzer then displays the protocol activity, grouped by the type hierarchy, as defined by the protocol. The default display shows each type in a separate column, from most the abstract object type down to least abstract type. Filtering can be applied to view the protocol behavior at a level of abstraction that is most suited to the required analysis task.

The Verification IP includes components and features to verify IP blocks, IP integration, SoC interconnect, complete SoCs, SoC protocols and interfaces. The PA can simplify debug for engineers verifying bus interfaces in SoCs by providing a graphical view of the protocol traffic. In at least some embodiments, the PA can display the protocol traffic generated from simulation runs using, for example, the verification IP in a high-level color-coded summary view and a more detailed symbol-view of the individual packets and payloads. Debug is accelerated by allowing designers to easily distinguish and browse traffic types and switch between the two views. In at least some embodiments, the Verification IP supports Verilog testbenches, and constrained random methodologies as defined in the proven Verification Methodology Manual (VMM) for SystemVerilog.

In at least some embodiments, the PA provides visualization and analysis of protocol objects. A protocol object is a general term that refers to any description of data that is found in a protocol specification. PA's support for a particular protocol includes the ability to view protocol behavior in terms of protocol-specific objects and the relationships between those objects. These relationships include parent/child associations, specialization/sub-types (e.g. different kinds of "packets") and predecessor/successor relationships, as described in further detail below.

Figure 13:
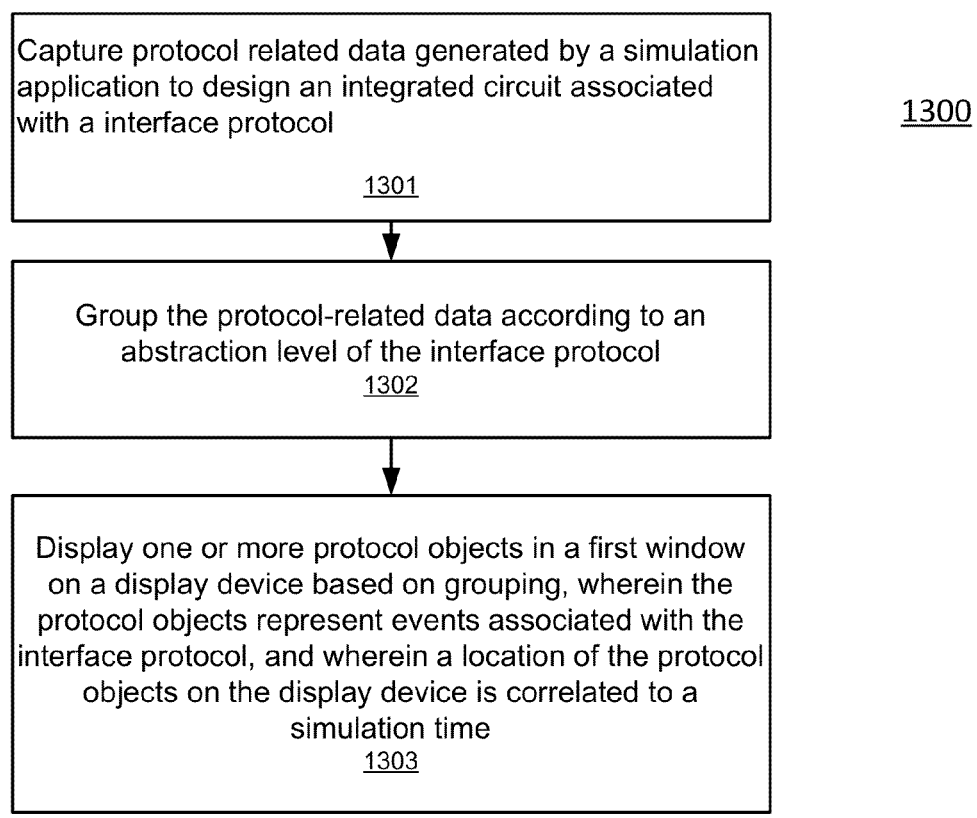
FIG. 13 shows a flowchart of a method to provide a graphical user interface to display an interface protocol activity according to one embodiment.

FIG. 13 shows a flowchart of a method 1300 to provide a graphical user interface to display an interface protocol activity according to one embodiment. Method 1300 begins with capturing protocol related data generated by a simulation application (e.g., a verification IP) at operation 1301. The simulation application can be executed to design, for example, a semiconductor integrated circuit associated with an interface protocol. The interface protocol can be for example, a complex interleaved protocol, such as an Universal Serial Bus 3.0 (USB), Advanced Microcontroller Bus Architecture Advanced eXtensible Interface (AMBA AXI), Peripheral Component Interconnect Express (PCI Express), double data rate (DDR), Serial Advanced Technology Attachment (SATA), High-Definition Multimedia Interface (HDMI), Mobile Industry Processor Interface (MIPI) and Ethernet protocol. Method 1300 continues at operation 1302 that involves grouping the protocol-related data according to an abstraction level of the interface protocol.

Figure 2:
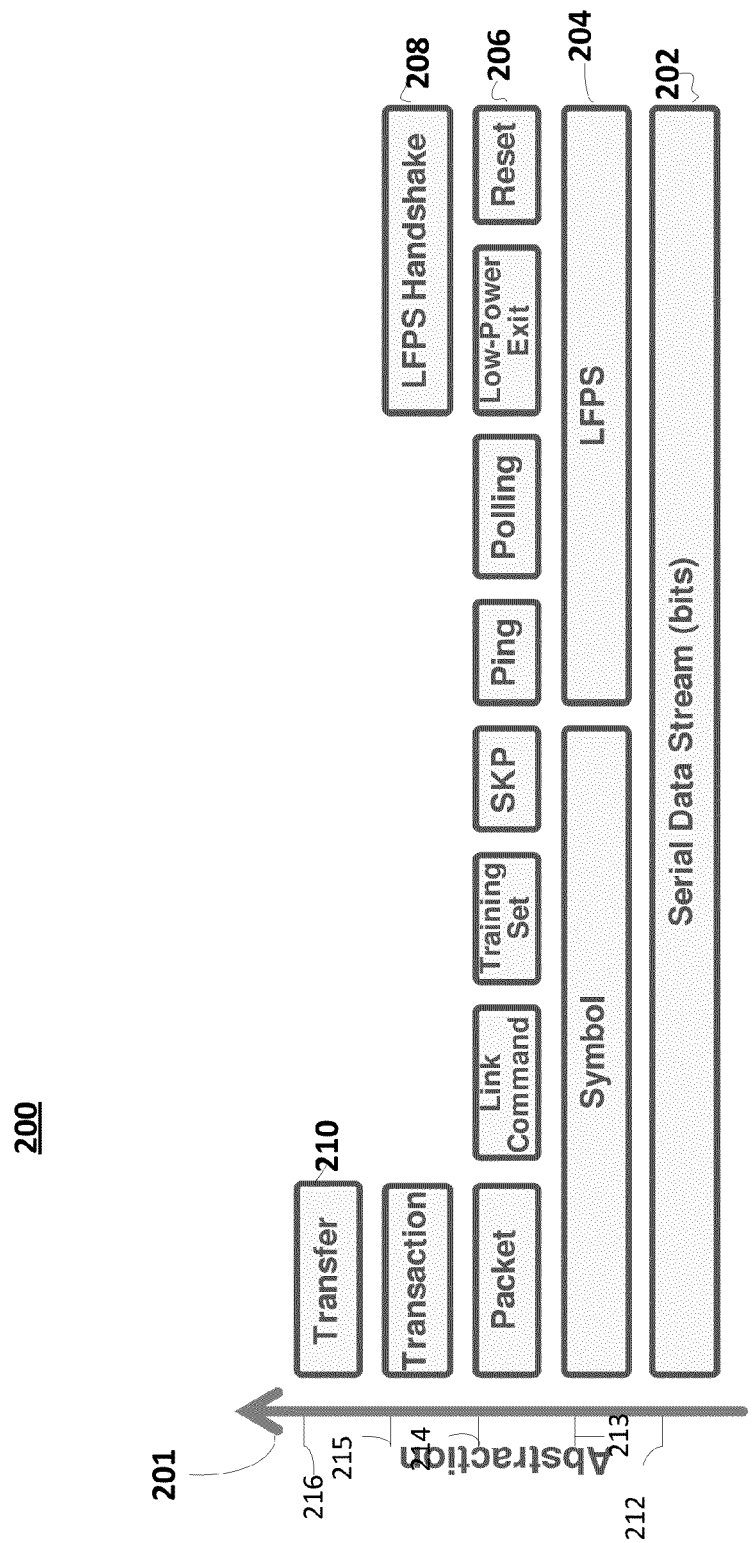
FIG. 2 shows a diagram illustrating an exemplary embodiment of grouping the protocol related data according to an abstraction level associated with an interface protocol.

FIG. 2 shows a diagram 200 illustrating one embodiment of grouping the protocol related data according to an abstraction level 201 associated with an interface protocol. The level of abstraction can be referred to an extent to which the data are grouped. At different levels of abstraction, such as levels 212-216 the data can be considered as being grouped into granularity units having different sizes. At a level of abstraction 212 the data are defined as a serial data stream (bits) 202. The granularity of the data at level 202 is the finest and corresponds to a bit.

A granularity unit at level 213, such as a unit 204, can comprise several bits. The granularity unit at level 213 can be, for example, a symbol, a low frequency periodic signal (LFPS), and the like. A granularity unit at level 214, such as a unit 206, can comprise symbols, and/or LFPS. The granularity unit at level 214 can be, for example, a packet, a link command, a training set, a SKP set (typically used to adjust clocks), a Ping command, a Polling command, a Low-Power exit command, a reset command, and the like. A granularity unit at level 215, such as a unit 208, can comprise packets, and/or commands. The granularity unit at level 215 can be, for example, a transaction, a LFPS handshake, and the like. A granularity unit at level 216 can comprise transactions. The granularity unit at level 216 can be, for example, a data transfer. In at least some embodiments, different protocols can have different layers of abstractions.

In at least some embodiments, a data transfer comprises a number of transactions comprising packets, where a transaction is in the order of a number of kilobytes, and a packet is about a kilobyte. Referring back to FIG. 13, method 1300 continues with operation 1303 that involves displaying one or more protocol objects in a window on a display device based on grouping of the protocol related data.

Figure 3A:
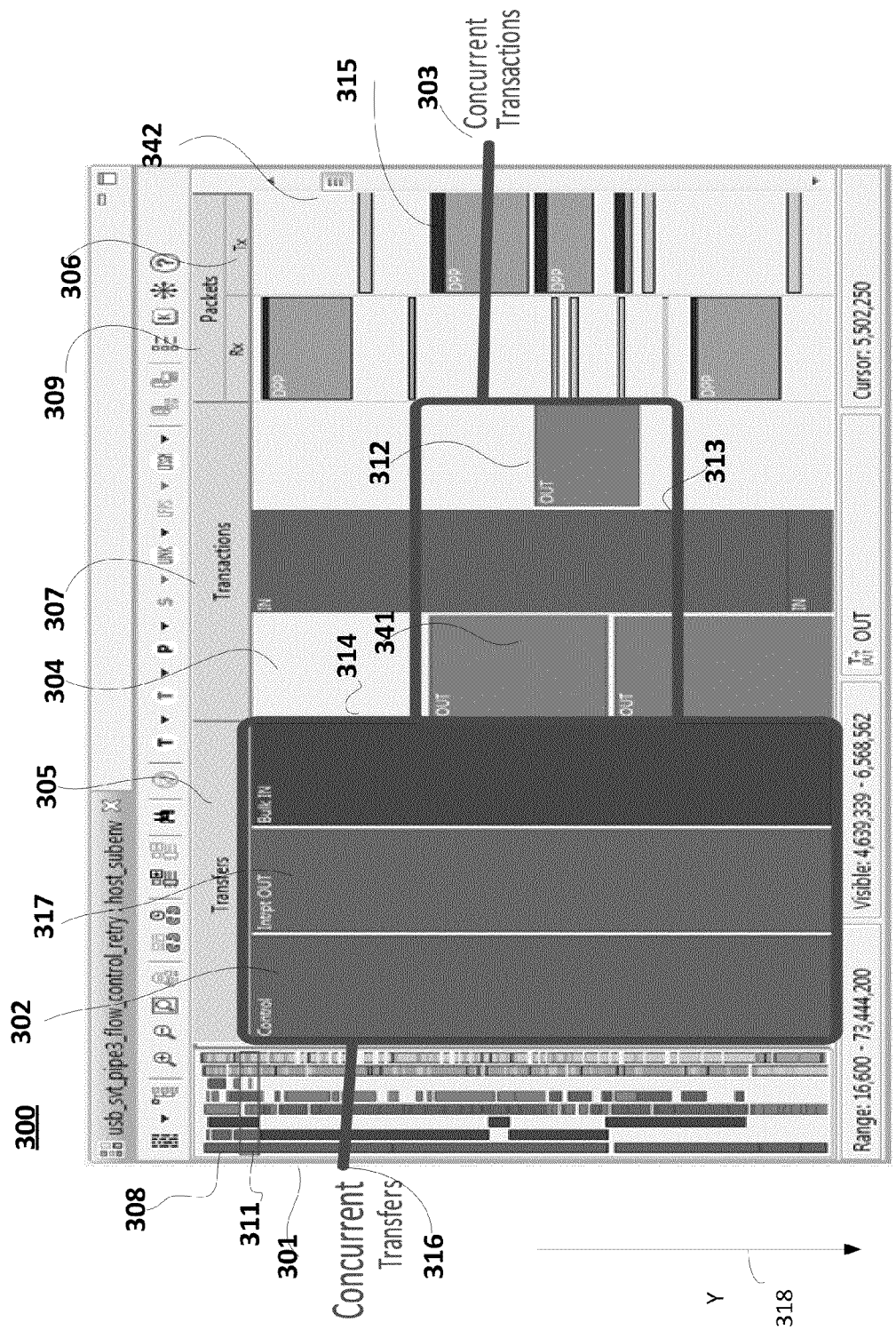
FIG. 3A shows an exemplary embodiment of a graphical user interface (GUI) 300 to display an interface protocol activity.

FIG. 3A shows an exemplary embodiment of a graphical user interface (GUI) 300 to display an interface protocol activity. FIG. 3A shows a timeline window 301 having a simulation overview portion 308, and a detailed view portion 342 that displays a selected portion 311 of the simulation in more detail. Detailed view portion 342 has columns, such as a column 305, a column 307, and a column 309 representing transfer, transaction, and packet abstraction levels of an interface protocol (e.g., USB 3.0 protocol). As shown in FIG. 3A, protocol objects, such as protocol objects 302, 314, 341, 312, and 315 are displayed in corresponding columns. The protocol objects represent events associated with the interface protocol, for example transfers, transactions, packets according to a level of abstraction. As shown in FIG. 3A, the graphical the protocol objects are displayed in vertical columns, using time-scaled boxes, where major columns, such as a column 305, a column 307, and a column 309 represent an abstraction level, sub-columns, such as a sub-column 317, a sub-column 304 and a sub-column 306 represent concurrent activity and a location of the protocol objects a long Y time axis 318 is correlated to the simulation time. In at least some embodiments, the number of sub-columns in the timeline window represents a maximum amount of concurrent activity, interleaved activity, or both.

In at least some embodiments, a vertical location of the protocol objects on the display device is correlated to a simulation time along a vertical Y axis. The protocol objects generated during a simulation are organized on a display device according to their type. In at least some embodiments, each type of the protocol objects is associated with a level of abstraction, for example, transfers are composed based on transactions, the transactions are composed based on packets, and so on, as set forth above.

The display of protocol objects in vertical columns using time-scaled boxes, where major columns represent the abstraction level, sub-columns represent concurrent activity, interleaved protocol activity, or both and the vertical location is correlated to the simulation time provides a clear representation of high-level protocol behavior, grouped according to level of abstraction, indicates concurrent protocol activity, interleaved protocol activity, or both, provides easier visualization of protocol object start and end times, provides easier visualization of protocol object start and end times, enhances traditional debug methods by showing object relationships through all levels of abstraction, and correlates protocol-related events with messages in the associated simulation transcript, as described in further detail below.

Unlike a waveform display as shown in FIG. 1, time is represented along a vertical y-axis 318 and increases from top to bottom of the window 301. As shown in FIG. 3A, each protocol object, such as such as protocol objects 302, 312, 313, and 315, is represented in the display as a box. In at least some embodiments, the size of the protocol objects along vertical time axis is associated with duration of a protocol event. For example, the top of the box corresponds to the start time of the object and bottom of the box corresponds to the end time of the object. The height of the box represents the duration of the object, such as time duration 316.

In at least some embodiments, different types of protocol objects can be displayed in different colors. In at least some embodiments, different protocol objects corresponding to the same level of abstraction can be displayed in different colors. For example, a control transfer object, such as an object 302 can be displayed in brown, an interrupt OUT transfer object can be displayed in green. In at least some embodiments, a color of the box corresponds to a type of the protocol object. In at least some embodiments, different types of protocol objects are associated with different abstraction levels of the protocol.

As shown in FIG. 3A, a horizontal x-axis 319 represents an object hierarchy. High abstraction level objects, for example transfer objects associated with an USB 3.0 bus interface protocol, are drawn starting in the left-most column 305. Objects are drawn such that they do not overlap. Therefore, more than one sub-column may be needed to draw the protocol objects associated with the same level of abstraction.

Multiple sub-columns indicate concurrent object activity, interleaved object activity, or both. The protocol objects associated with concurrent protocol events, interleaved protocol events, or both are displayed in different sub-columns, as shown in FIG. 3A. For example, concurrent transfers, such as control transfer 302, interrupt OUT transfer 317, and bulk IN transfer 314 are performed at a time range 316. The next level of abstraction objects that are part of the top-level objects are drawn in the next column to the right. As shown in FIG. 3A, the transaction objects that are part of the transfer objects are displayed in a column 307, and packet objects that are part of the transaction objects are in column 309. As shown in FIG. 3A, concurrent transactions, such as OUT transactions 312 and 341, and an IN transaction 313 are performed at time range 316.

Displaying protocol objects as described herein provides a time-centric view of the simulation in terms of protocol objects, highlights concurrent object activity, interleaved protocol activity, or both, shows the relative duration of different objects, shows the hierarchical relationships between objects, provides insight into how the duration of child objects contribute to the duration of their parent objects, highlights the various types of objects in the simulation, and provides correlation between error messages and protocol objects, as described in further detail below.

Figure 3B:
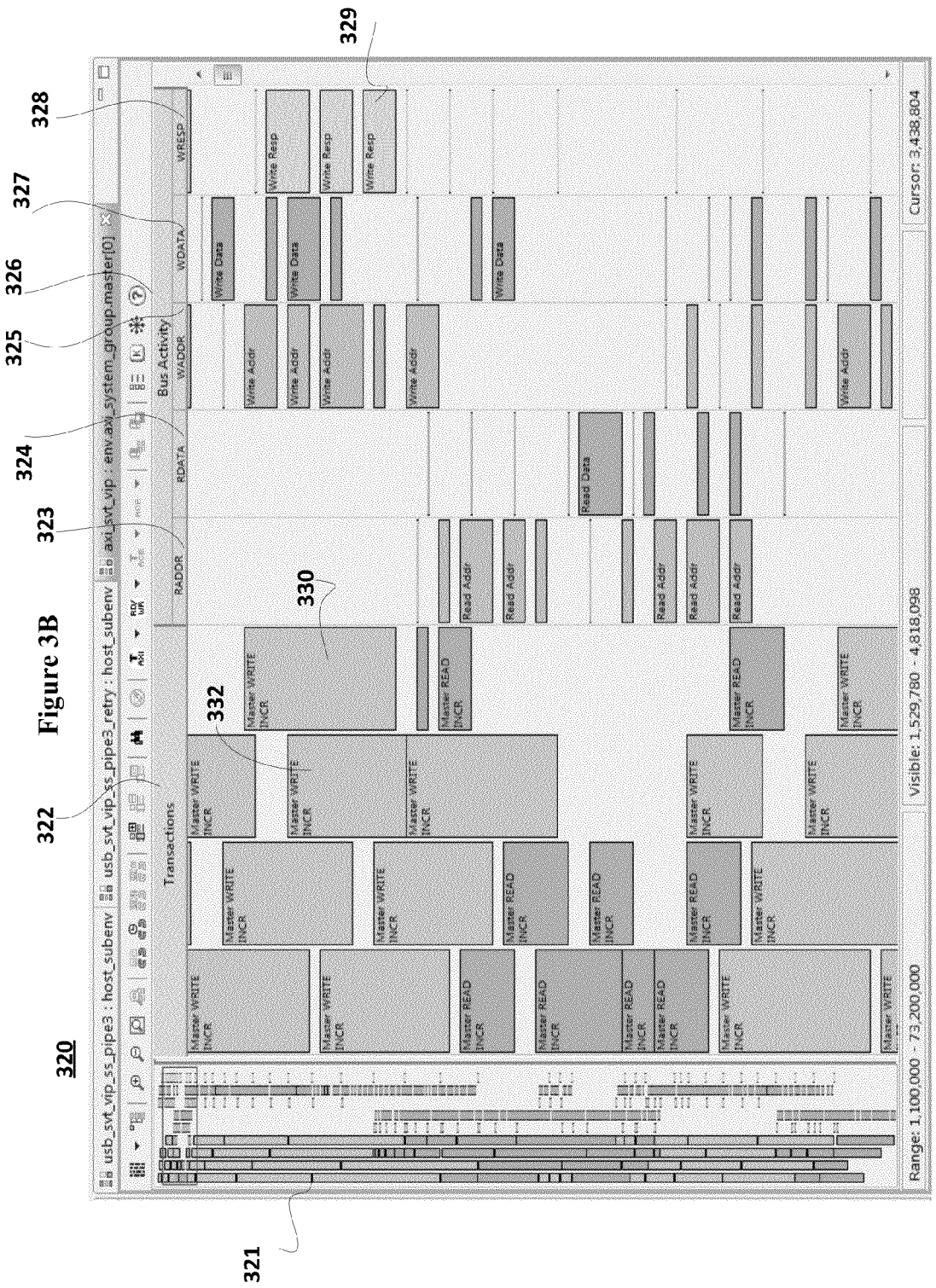
FIG. 3B shows another exemplary embodiment of a graphical user interface (GUI) 320 to display interface protocol activity.

FIG. 3B shows another exemplary embodiment of a graphical user interface (GUI) 320 to display interface protocol activity. FIG. 3B shows a timeline window having a whole simulation overview portion 321, and a detailed view portion that displays a selected portion 331 in more detail. The detailed view portion has columns, such as a column 322, and a column 326 corresponding to transactions and bus activity levels of abstraction of an interface protocol (e.g., AMBA AXI) respectively. The protocol objects, such as protocol objects 332, 330, and 329, and 315 are displayed in respective columns. The protocol objects represent events associated with the interface protocol, for example, transactions, and bus activity events according to a level of abstraction. As shown in FIG. 3B, the graphical the protocol objects are displayed in time-scaled boxes, where major columns, e.g., a column 322, and a column 326 represent an abstraction level, sub-columns, e.g., sub-columns 323, 324, 325, 326, 327, and 328 represent concurrent bus activity, interleaved bus activity, or both and a location of the protocol objects a long vertical time axis is correlated to the simulation time. As shown in FIG. 3B, transaction protocol object 332 and transaction protocol object 330 displayed in corresponding sub-columns represent protocol events that are overlapped in time.

Figure 14B:
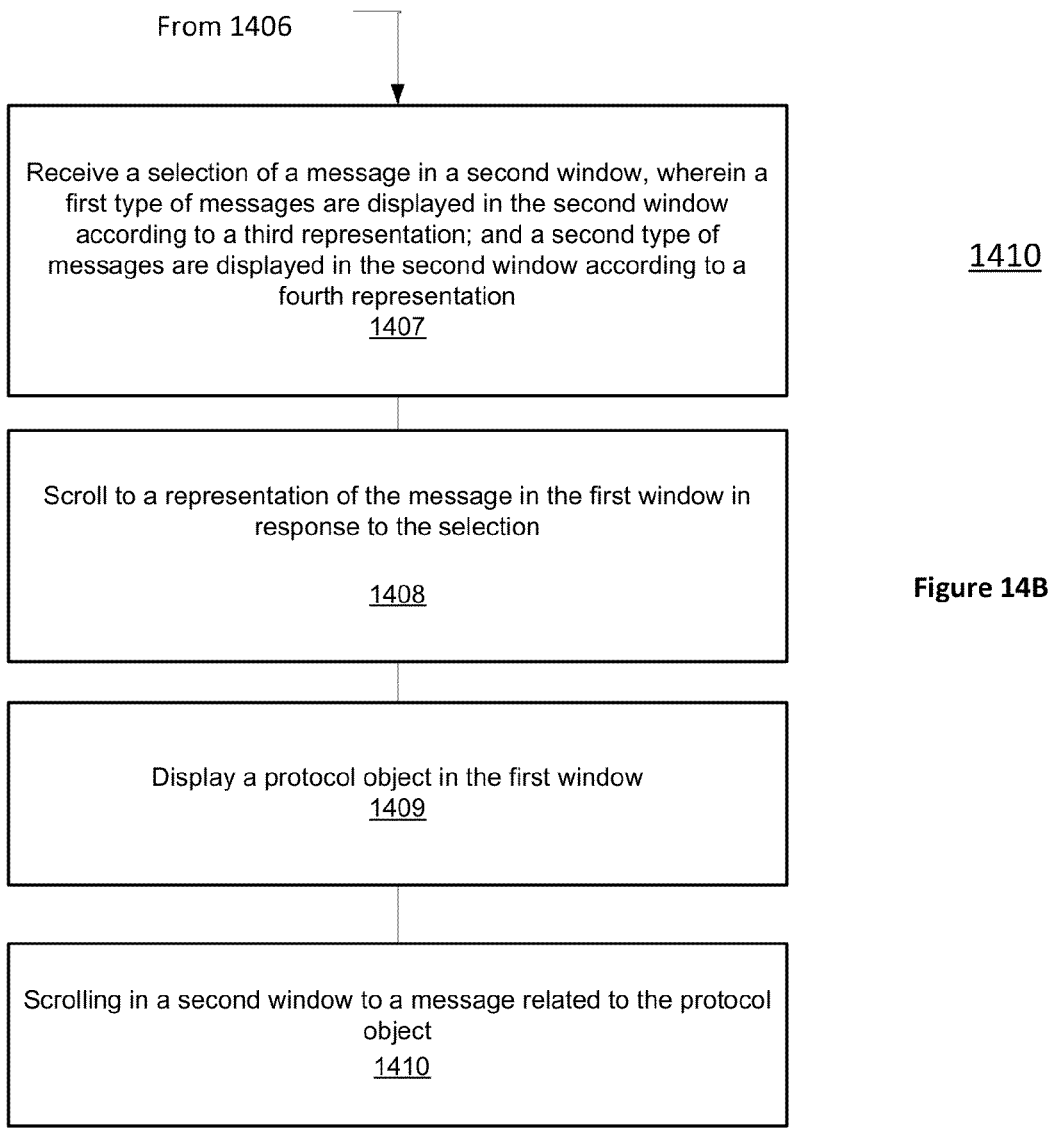

FIGS. 14A and 14B show a flowchart of an exemplary embodiment of a method 1400 to display interface protocol activity that indicates concurrent protocol behavior, interleaved protocol behavior, or both and correlates the protocol activity to simulation progress. A selection of a first protocol object in a first window on a display device is received at operation 1401. For example, the first protocol object represent events associated with a first abstraction level of an interface protocol. The first window can be a timeline window as described herein. In at least some embodiments, the first window has a first type of protocol objects associated with a first level of abstraction displayed in a first column, and a second type of protocol objects associated with a second level of abstraction displayed in a second column, as described herein.

Figure 5A:
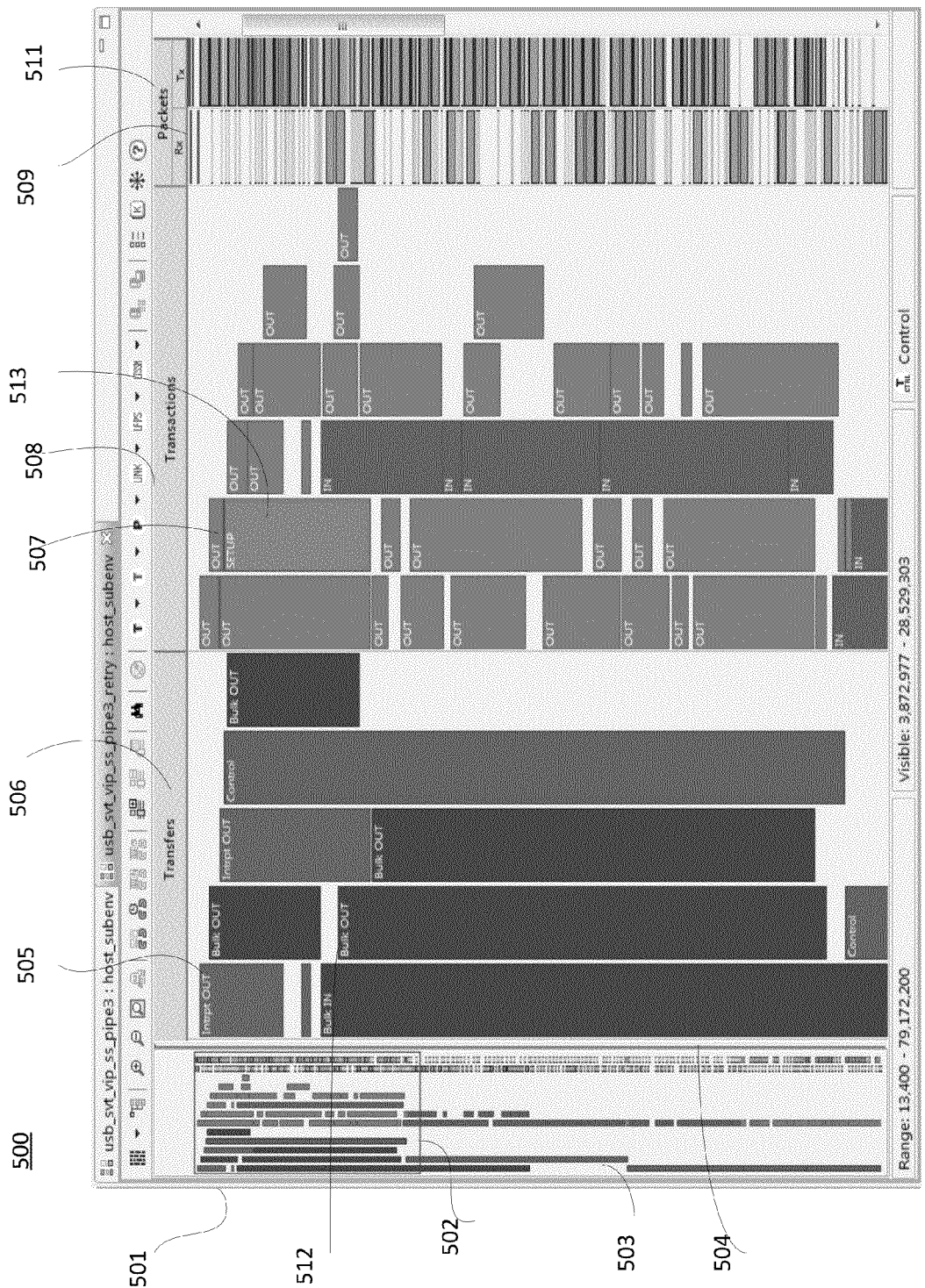
FIG. 5A shows an exemplary embodiment of a timeline window to display an interface protocol activity.

FIG. 5A shows an exemplary embodiment of a timeline window 500 to display an interface protocol activity. Timeline window 501 has a simulation overview portion 503, and a detailed view portion displaying a selected portion of the simulation 502 in more detail. The detailed view portion has columns, such as a column 506, a column 508, and a column 509 representing a transfer level, a transaction level, and packet level of abstraction of an interface protocol (e.g., USB 3.0 protocol). The protocol objects representing protocol events are displayed as boxes along a vertical timeline 504, as described above.

The protocol objects representing concurrent events, interleaved events, or both are displayed in sub-columns, such as a packet sub-column 511, as described above. In at least some embodiments, the protocol objects representing different protocol events are displayed differently (e.g., in different colors). For example, the protocol object representing OUT transaction and SETUP transaction can be displayed in different colors (e.g., brown and green). In at least some embodiments, the protocol objects representing similar events are displayed similarly (in same color). For example, the protocol objects representing Interrupt OUT transfers can be displayed in the same color, as an Interrupt OUT transfer object 505 (e.g., chocolate).

Figure 5B:
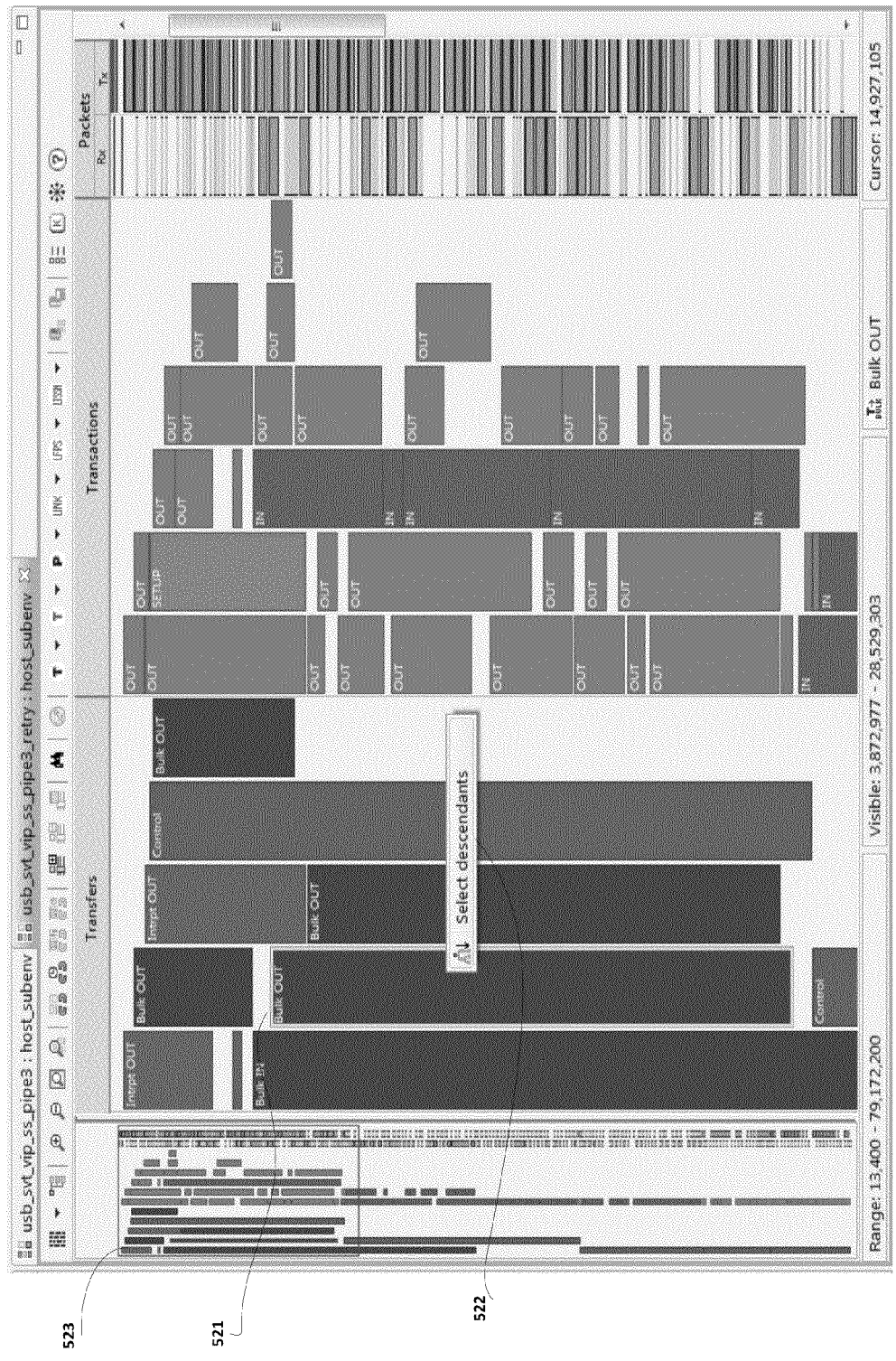
FIG. 5B is an exemplary embodiment of a GUI similar to FIG. 5B, after receiving a selection of the first protocol object.

FIG. 5B is an embodiment of a GUI 510 similar to FIG. 5B, after receiving a selection of the first protocol object. The selection of the protocol object can be received example, via a cursor, mouse, touching the screen of the display device, keyboard, voice, or any other techniques known to one of ordinary skill in the data processing art. As shown in FIG. 5B, a protocol object 521 is selected. The selection of the protocol object on the display device can be shown, for example, by highlighting the object, or any of techniques known to one of ordinary skill in the data processing art. In at least some embodiments, a pop-up window, such as a window 522 can be displayed over the selected object to indicate that the selection is made to select descendants.

Referring back to FIG. 14A, method 1400 continues with operation 1402 that involves selecting one or more second protocol objects related to the first protocol object in the first window in response to receiving the selection of the first protocol object. In at least some embodiments, the one or more second protocol objects are the objects that represent events associated with a second abstraction level of the interface protocol. In at least some embodiments, the second protocol objects are descendants of the selected first parent (ancestor) protocol object. In at least some embodiments, the one or more second protocol objects are one or more parents or sources of the selected first descendant protocol object.

Figure 5C:
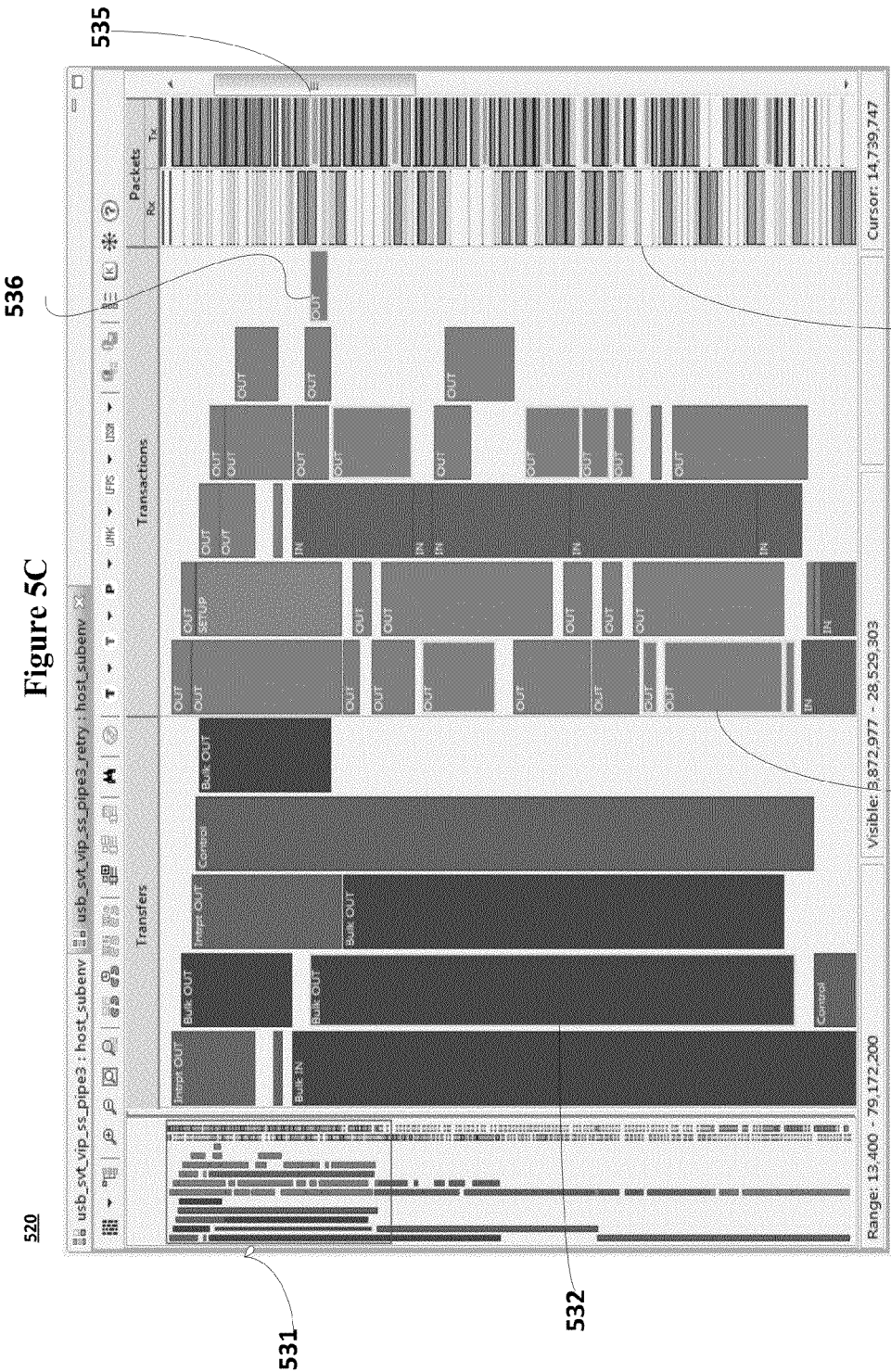
FIG. 5C is an exemplary embodiment of a GUI similar to FIG. 5C, after one or more second protocol objects related to the first protocol object are selected.

FIG. 5C is an embodiment of a GUI 520 similar to FIG. 5C, after one or more second protocol objects related to the first protocol object are selected. As shown in FIG. 5C, the descendants of the selected parent transfer object 532, e.g., descendant transaction objects, such as objects 533 and 536, and descendant packets objects, such as objects 534 and 535 are selected. The selection of the protocol objects on the display device can be shown, for example, by highlighting the objects, or any of techniques known to one of ordinary skill in the data processing art. Selecting one or more second objects related to the selected protocol object can show the hierarchical relationships between objects, and can provide insight into, for example, how the duration of child objects contribute to the duration of their parent objects, and vice versa.

Figure 4:
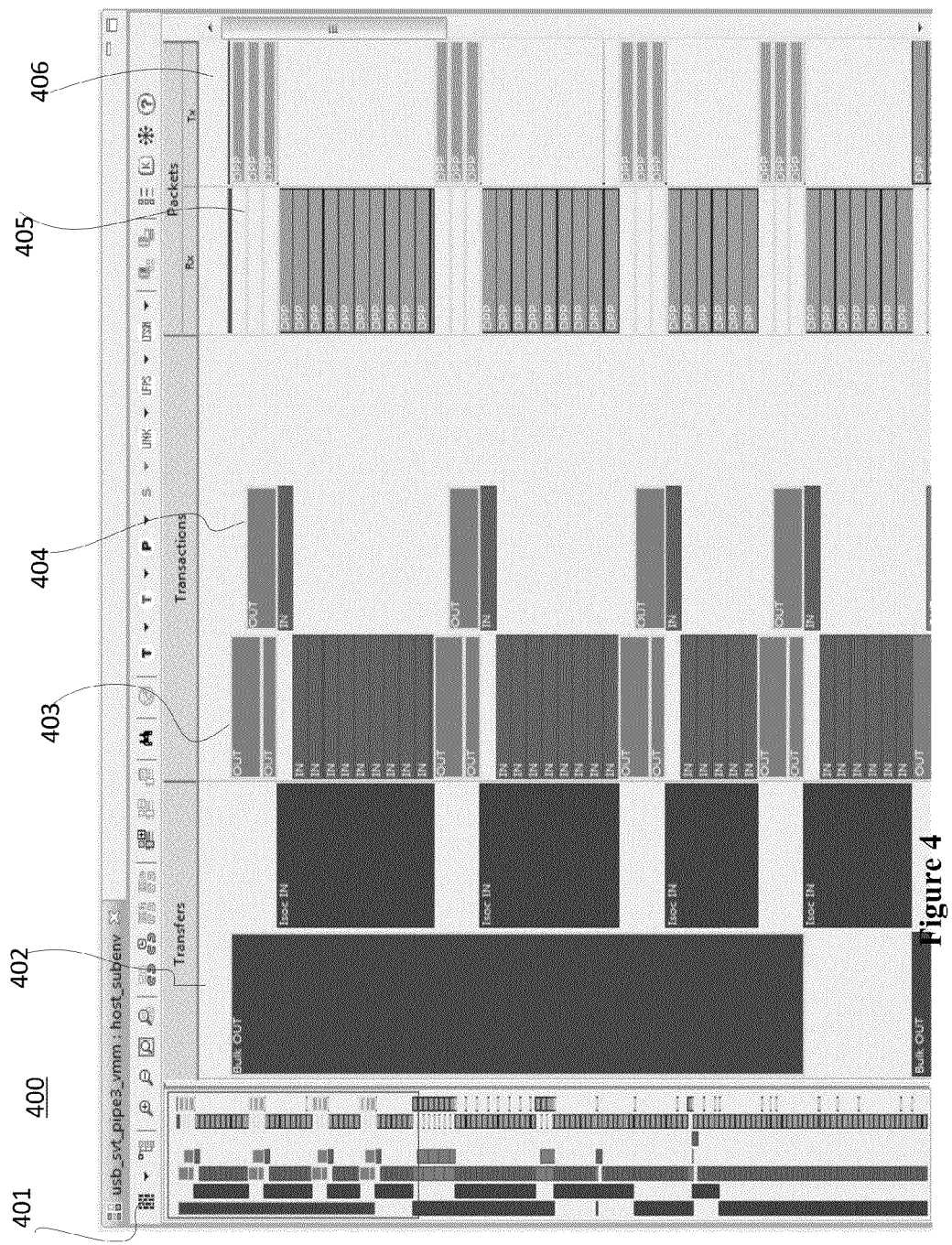
FIG. 4 shows an exemplary embodiment of a timeline window to select one or more protocol objects related to a selected protocol object.

FIG. 4 shows an exemplary embodiment 400 of a timeline window 401 to select one or more protocol objects related to a selected protocol object. A timeline window 401 has a selected Bulk OUT transfer object 402. As shown in FIG. 4, the protocol objects, e.g., an OUT transaction object 403, an OUT transaction object 404, a received (Rx) packet 405, a transmitted (Tx) packet 406 that are descendants (e.g., children) of the selected Bulk Out transfer object 402 are selected. As shown in FIGS. 4, 5A-5C, embodiments of the methods described herein provide insight into how the duration of child objects contribute to the duration of their parent objects.

Figure 6:
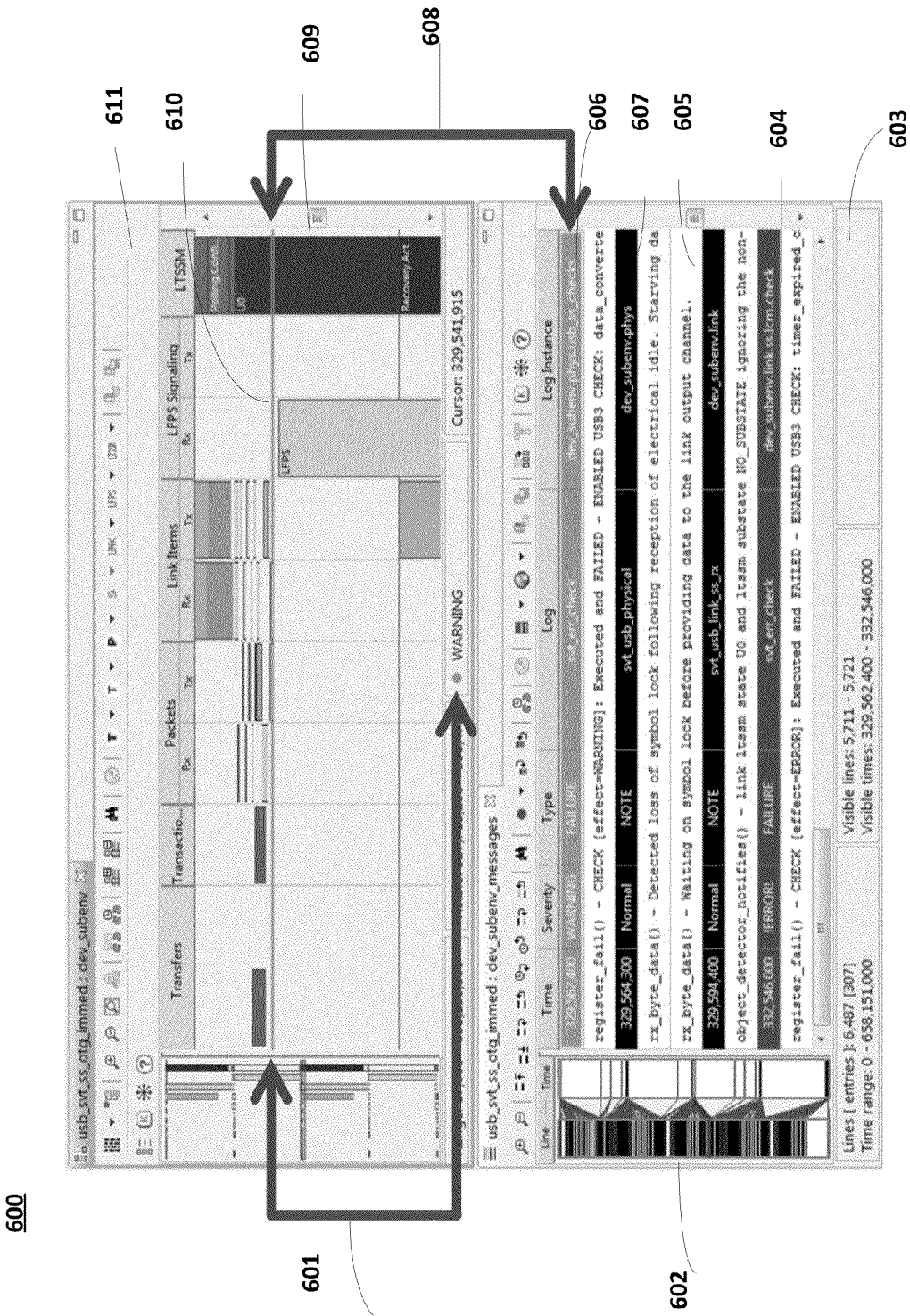
FIG. 6 shows one embodiment of correlating a timeline window and a simulation log file window.

FIG. 6 shows one embodiment of correlating a timeline window and a simulation log file window. A timeline window 611 has an overview portion of a whole simulation, and a detailed view portion displaying a selected protocol activity of the simulation along a vertical timeline, as described above. The detailed view portion has columns representing different levels of abstraction of an interface protocol, as described above. A simulation log file window 603 has an overview portion 602 displaying messages generated during whole simulation time.

The left column in the overview 602 shows the message density, as it were, how big the messages are and where they are. The right column indicated as time, shows the distribution of the messages across the simulation time. As shown in FIG. 6, the messages are distributed from time zero or startup all the way down to the end of this simulation.

In at least some embodiments, the time that's being viewed in timeline window 611 is synchronized with the log messages that are at about the same time. So if the time line window 611 is scrolled, the log file window 603 is scrolled as well, as described in further detail below. In at least some embodiments the simulation log file window and timeline window are synchronized in time, as described in further detail below.

Simulation log file window 603 has a detailed view portion displaying messages, e.g., messages 604, 605, and 606. Timeline window 611 has a representation of a message (e.g., a line 610). As shown in FIG. 6, timeline window 611 has a protocol object that is an indication 601 of a type of the message (e.g., warning message) represented by line 610. In at least some embodiments, displaying one or more protocol objects (e.g., a representation of a warning message) in a timeline window is correlated with displaying one or more messages in a simulation log file window. As shown in FIG. 6, displaying a representation of a message (e.g., line 610) in a timeline window is correlated 608 with displaying the message (e.g., a warning message 606) in a simulation log file window 603.

Figure 7:
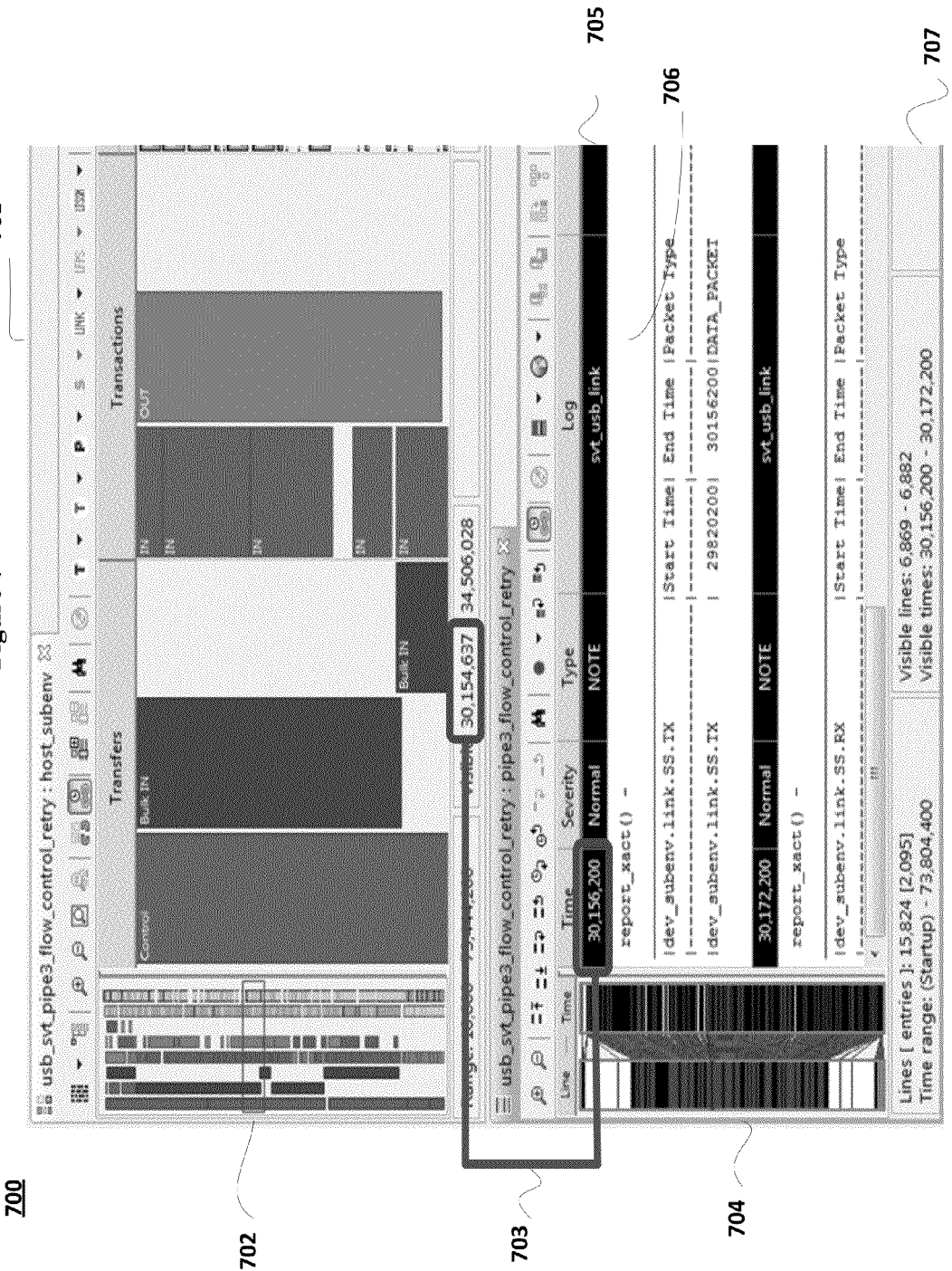
FIG. 7 shows another embodiment of correlating a timeline window and a simulation log file window.

FIG. 7 shows another embodiment of correlating a timeline window and a simulation log file window. A timeline window 701 has an overview portion of a whole simulation 702, and a detailed view portion displaying a selected protocol activity of the simulation along a vertical timeline, as described above. The detailed view portion has columns representing different levels of abstraction of an interface protocol, as described above.

A simulation log file window 707 has an overview portion displaying all messages generated during whole simulation time 704 and a detailed view portion displaying selected messages 706. As shown in FIG. 7, a simulation log file window 707 has a header 707 showing characteristics of the message, e.g., a time when a message is generated, a severity of the message, a type of the message, and a log of the message. The simulation log file window 707 has a body of the message 706. As shown in FIG. 7, displaying the one or more protocol objects in timeline window 701 is correlated in time 703 with displaying one or more messages in simulation log file window 707.

Figure 8:
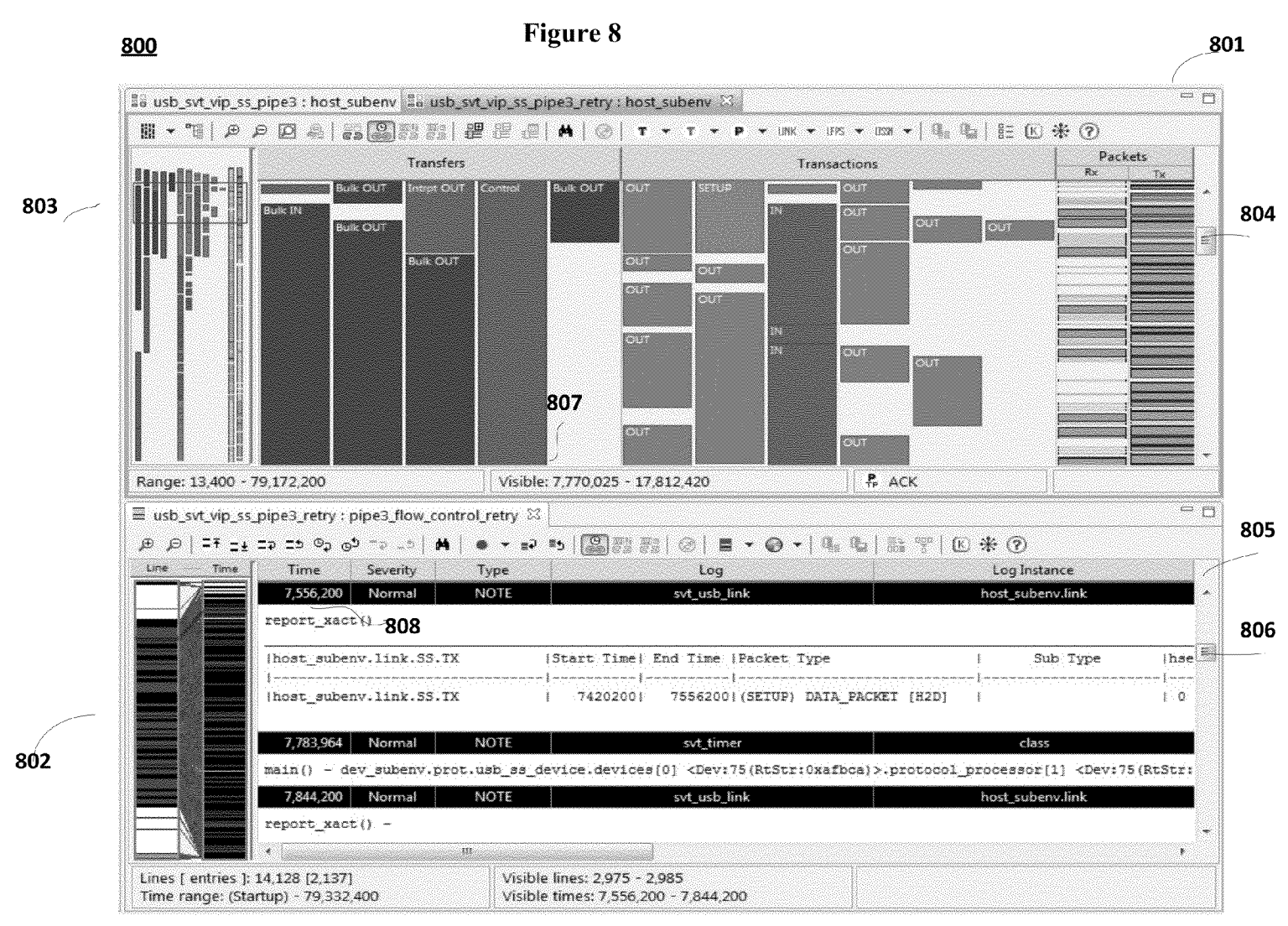

FIG. 8 shows another embodiment of correlating a timeline window and a simulation log file window. A timeline window 801 has an overview portion of a whole simulation 803, and a detailed view portion displaying a selected protocol activity of the simulation along a vertical timeline, as described above. The detailed view portion has columns representing different levels of abstraction of an interface protocol, as described above. A timeline window has a scroll bar 804 to scroll the detailed view portion in a vertical direction in time 807. A simulation log file window 805 has an overview portion displaying all messages generated during whole simulation time 802 and a detailed view portion displaying selected messages, as described above. As shown in FIG. 8, a simulation log file window 805 has a header showing characteristics of the message, e.g., a time 808 when a message is generated, a severity of the message, a type of the message, and a log, and a log instance of the message, and a body of the message, as described above. Simulation log file window 805 has a scroll bar 806. In at least some embodiments, displaying one or more protocol objects in the timeline window causes displaying one or more messages in the simulation log file window that are related to the protocol objects in the timeline window. As shown in FIG. 8, displaying one or more protocol objects that are generated at time 807 in a detailed view of the timeline window 801 by, e.g., moving a scroll bar 804 causes scrolling simulation log file window 805 to display one or more messages generated at time 808 that are related to the protocol objects generated at time 807.

Figure 9:
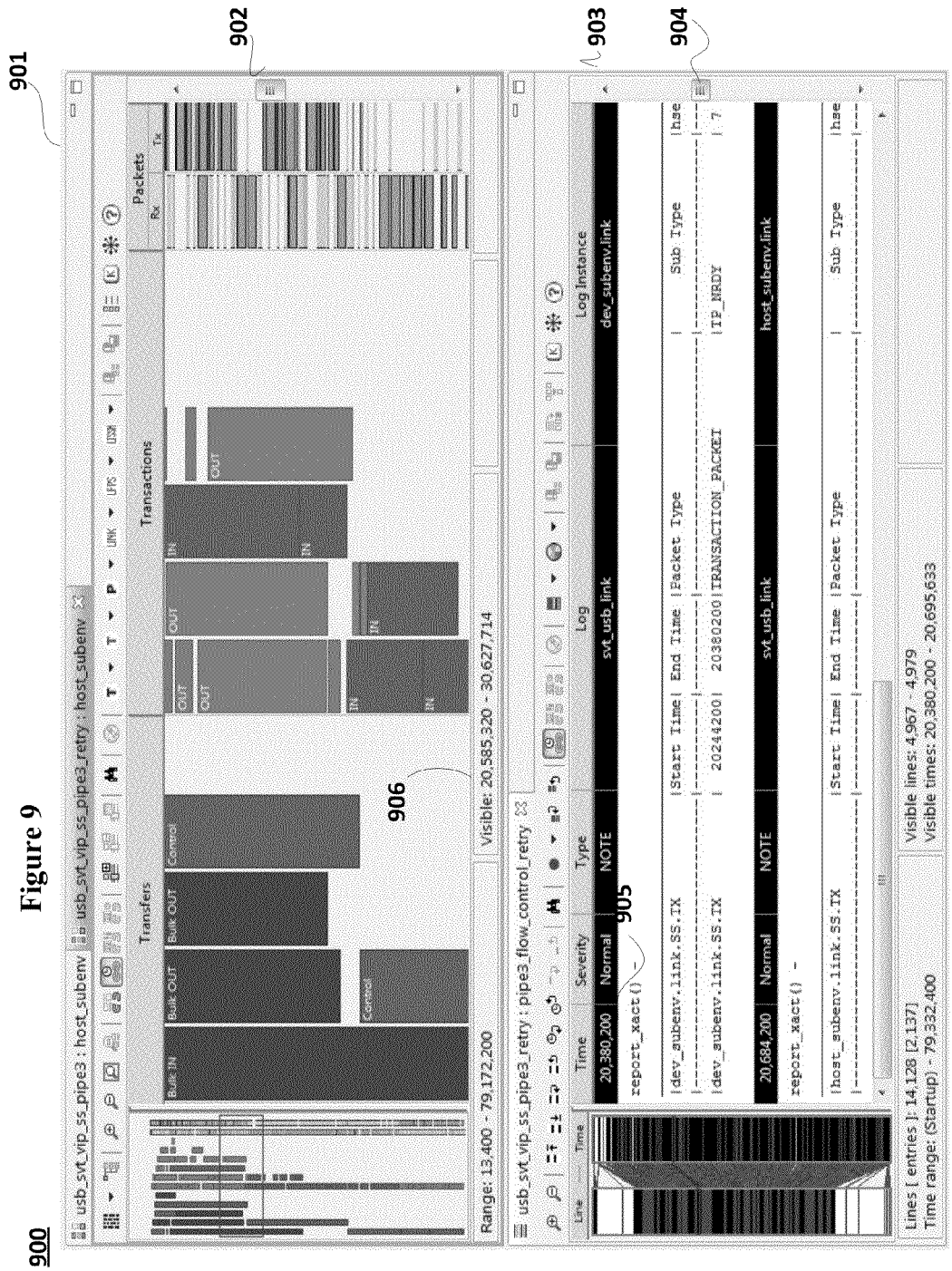
FIG. 9 is a view similar to FIG. 8, after a scroll bar in a simulation log file window is moved to display one or more messages.

In at least some embodiments, displaying one or more messages in the simulation log file window causes displaying one or more protocol objects in the timeline window that are related to the messages in the simulation log file window. FIG. 9 is a view similar to FIG. 8, after a scroll bar in a simulation log file window is moved to display one or more messages. As shown in FIG. 9, displaying one or more messages that are generated at a time 905 in a simulation log file window 903 by, e.g., moving a scroll bar 904 causes scrolling timeline window 901 to display one or more protocol objects generated at time 906 that are related to the messages generated at time 905.

Referring back to FIG. 14A, method 1400 continues with operation 1403 involving receiving a request to annotate a message associated with at least one of the protocol events. In response to receiving the request to annotate the message, a representation of the message in the first window is displayed at operation 1404.

Figure 10:
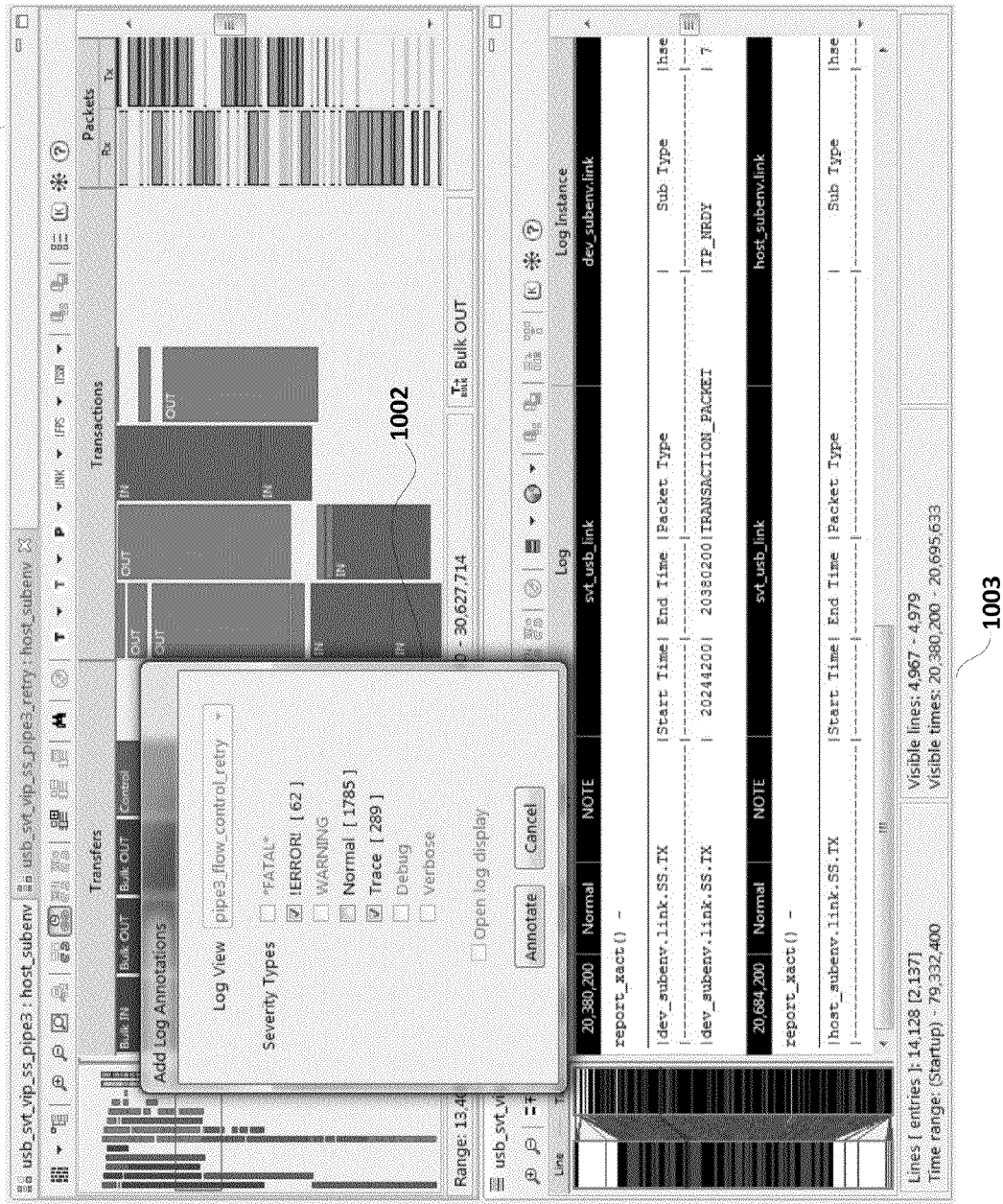
FIG. 10 shows one embodiment of a graphical user interface 1000 to annotate a message.

FIG. 10 shows one embodiment of a graphical user interface 1000 to annotate a message. As shown in FIG. 10, a user can open an annotation menu window 1002 to select messages from a simulation log file window 1003. As shown in FIG. 10, trace and error messages are selected.

Figure 11:
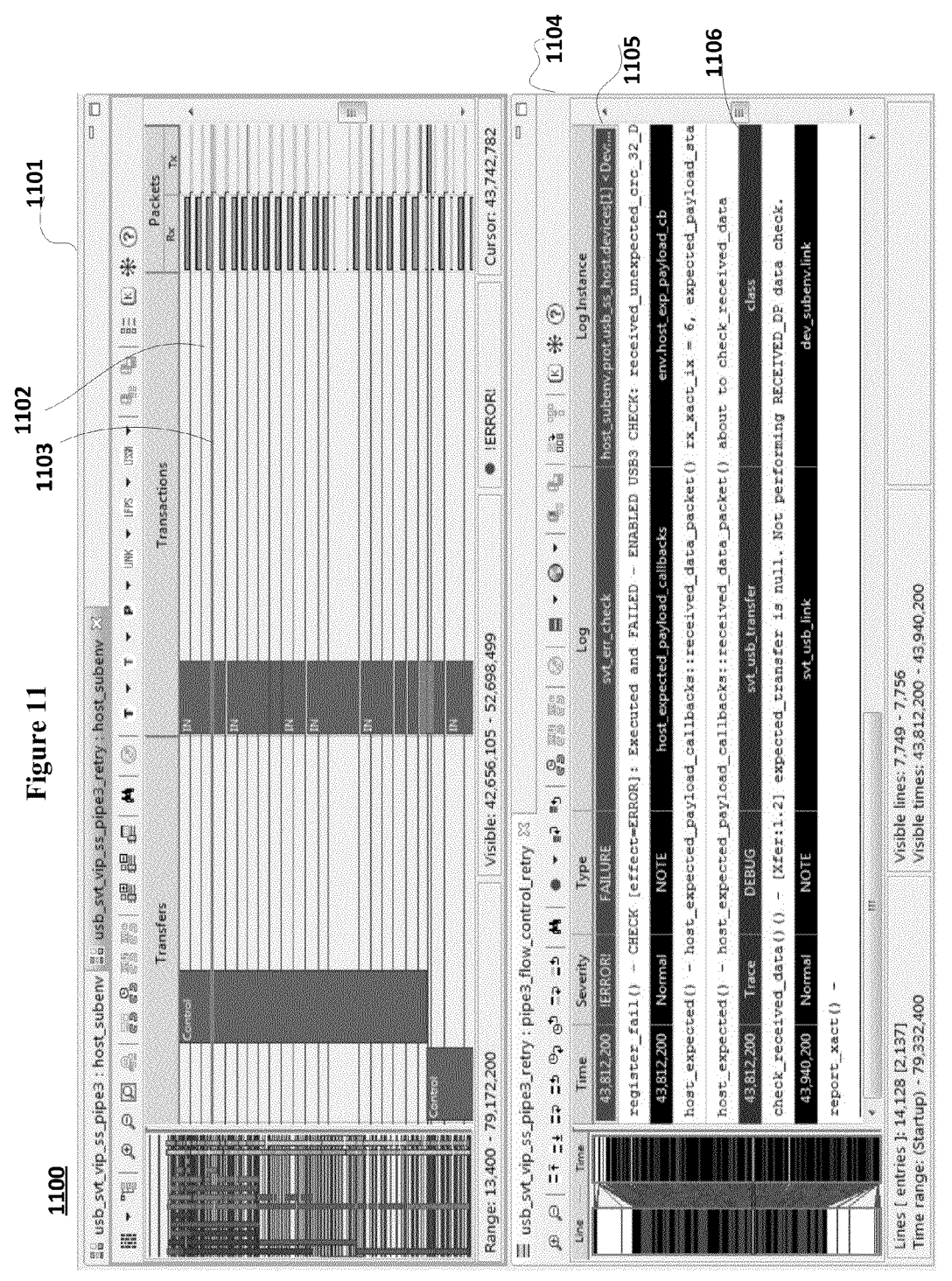

FIG. 11 is a view 1100 similar to FIG. 10, after a representation of the message selected in the annotation window is displayed in a timeline window. As shown in FIG. 11, timeline window 1101 shows representations of the trace messages, such as a representation 1102 of a trace message 1106 shown in a simulation log file window 1104 and representations of the error messages, such as a representation 1103 of an error message 1105 shown in simulation log file window 1104. In at least some embodiments, a message in the timeline window is represented by a line. In at least some embodiments, a first type of messages (e.g., error messages, such as an error message 1105) and their representations, such as representation 1103, are displayed according to a first representation (in a first color, e.g., red); and a second type of messages (e.g., trace messages, such as a trace message 1106) and their representations, such as representation 1102 are displayed according to a second representation (in a second color, e.g., blue).

Figure 12:
FIG. 12 shows one embodiment of a graphical user interface 1200 displaying a message in a pop-up window.

Referring back to FIG. 14A, method 1400 continues with operation 1405 involving receiving a selection of the representation of the message in the first window. In response to the selection of the representation of the message in the first window, the message is displayed in a pop-up window at operation 1406. FIG. 12 shows one embodiment of a graphical user interface 1200 displaying a message in a pop-up window. A pop-up window 1202 is displayed over a selected representation of a message 1201 in a timeline window 1203. Pop-up window 1202 shows characteristics and a body of the message.

Referring to FIG. 14B, method 1400 continues with operation 1407 involving receiving a selection of a message in a second window, wherein a first type of messages are displayed in the second window according to a third representation, and a second type of messages are displayed in the second window according to a fourth representation, as described above. At operation 1408, the first window is scrolled to display a representation of the message in response to the selection, as described above. At operation 1409 a protocol object is displayed in the first window.

At operation 1410, a second window is scrolled to a message related to the protocol object displayed in the first window, as described above. In at least some embodiments, any of the pairs of operations 1401-1402, 1403-1404, 1405-1406, 1407-1408, and 1409-1410 can be performed in any order relative to any other pairs of operations 1401-1402, 1403-1404, 1405-1406, 1407-1408, and 1409-1410.

The embodiments of a protocol analyzer as described herein accelerate the investigation of protocol behavior by providing protocol-oriented analysis and debug capabilities in verification environments for example, such as Synopsys Verification IP.

This is accomplished by displaying protocol behavior in terms of protocol-specific objects, showing the relationships between those objects and correlating protocol-related events with the associated simulation transcript. These capabilities not only reduce the time required to identify the source of bugs that can be directly attributed to protocol behavior, but also provide insight into aspects of the operation of a design that might otherwise be missed.

Figure 15:
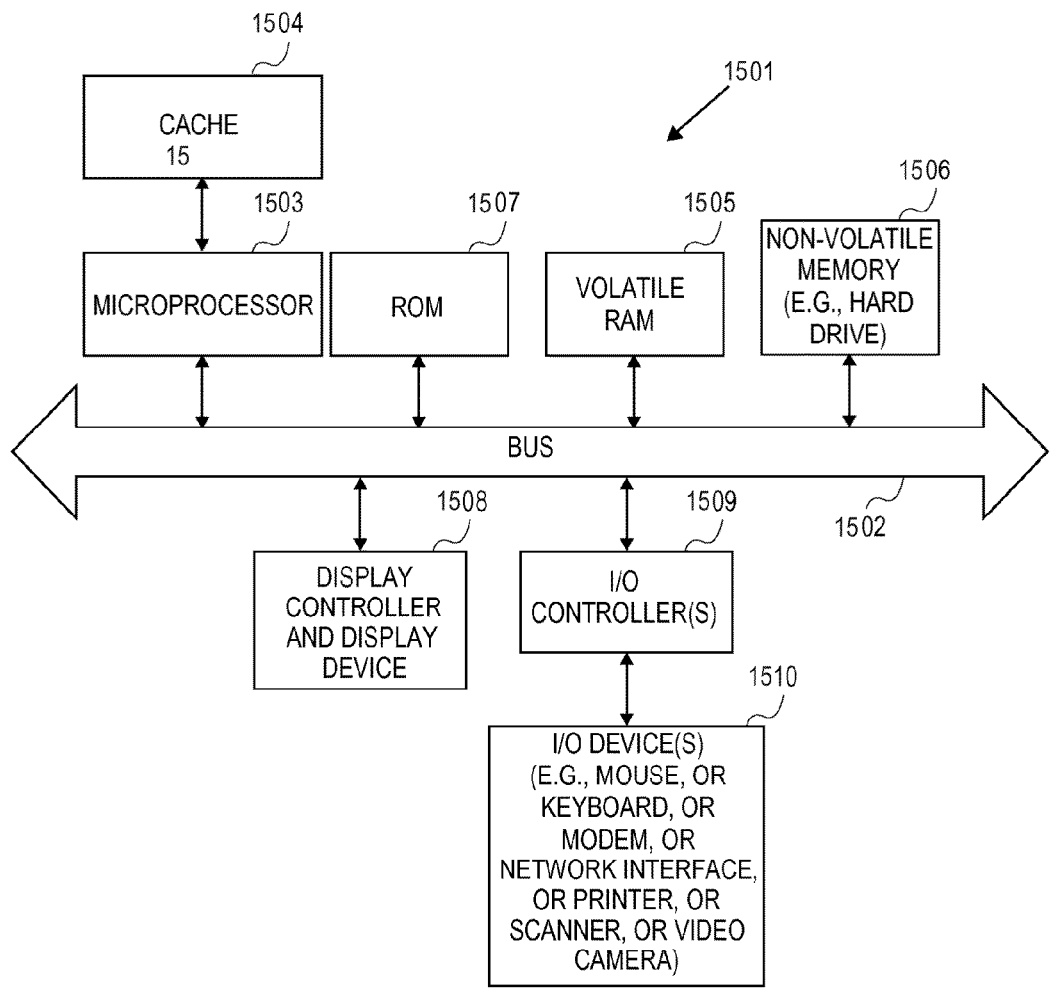
FIG. 15 shows one example of a computer system according to one embodiment.

FIG. 15 shows one example of a computer system according to one embodiment. Note that while FIG. 15 illustrates various components of a computer system, it is not intended to represent any particular architecture or manner of interconnecting the components as such details are not germane to methods and apparatuses as described herein. It will also be appreciated that network computers and other data processing systems which have fewer components or perhaps more components may also be used with described embodiments. The computer system of FIG. 15 may, for example, be an Apple Macintosh® computer.

As shown in FIG. 15, the computer system 1501, which is a form of a data processing system, includes a bus 1502 which is coupled to a microprocessor 1503 and a ROM 1507 and volatile RAM 1505 and a non-volatile memory 1506. The microprocessor 1503, which may be, for example, a G3 or G4 microprocessor from Motorola, Inc., or IBM is coupled to cache memory 1504 as shown in the example of FIG. 15. The bus 1502 interconnects these various components together and also interconnects these components 1503, 1507, 1505, and 1506 to a display controller and display device(s) 1508 and to peripheral devices such as input/output (I/O) devices 1510 which may be mice, keyboards, modems, network interfaces, printers, scanners, video cameras and other devices which are well known in the art.

Typically, the input/output devices 1510 are coupled to the system through input/output controllers 1509. The volatile RAM 1505 is typically implemented as dynamic RAM (DRAM) which requires power continually in order to refresh or maintain the data in the memory. The non-volatile memory 1506 may be a magnetic hard drive, a magnetic optical drive, an optical drive or a DVD RAM and other type of memory systems which maintain data even after power is removed from the system. The non-volatile memory 1506 may be a random access memory.

While FIG. 15 shows that the non-volatile memory is a local device coupled directly to the rest of the components in the data processing system, it will be appreciated that embodiments as described herein may utilize a non-volatile memory which is remote from the system, such as a network storage device which is coupled to the data processing system through a network interface such as a modem or Ethernet interface. The bus 1502 may include one or more buses connected to each other through various bridges, controllers and/or adapters as is well known in the art. In one embodiment the I/O controller 1509 includes a USB (Universal Serial Bus) adapter for controlling USB peripherals, and/or an IEEE-1394 bus adapter for controlling IEEE-1394 peripherals.

It will be apparent from this description that methods and apparatuses as described herein may be embodied, at least in part, in software. That is, the techniques may be carried out in a computer system or other data processing system in response to its processor, such as a microprocessor, executing sequences of instructions contained in a memory, such as ROM 1507, volatile RAM 1505, non-volatile memory 1506, cache 1504 or a remote storage device.

In various embodiments, hardwired circuitry may be used in combination with software instructions to implement embodiments as described herein. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 1503, or microcontroller.

A machine readable medium can be used to store software and data which when executed by a data processing system causes the system to perform various methods as described herein. This executable software and data may be stored in various places including for example ROM 107, volatile RAM 105, non-volatile memory 106 and/or cache 104 as shown in FIG. 15. Portions of this software and/or data may be stored in any one of these storage devices.

Thus, a machine readable medium includes any mechanism that provides (i.e., stores and/or transmits) information in a form accessible by a machine (e.g., a computer, network device, cellular phone, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; and the like.

The methods as described herein can be implemented using dedicated hardware (e.g., using Field Programmable Gate Arrays, or Application Specific Integrated Circuit) or shared circuitry (e.g., microprocessors or microcontrollers under control of program instructions stored in a machine readable medium. The methods as described herein can also be implemented as computer instructions for execution on a data processing system, such as system 1500 of FIG. 15.

Many of the methods as described herein may be performed with a digital processing system, such as a conventional, general-purpose computer system. The computer systems may be, for example, entry-level Mac Mini® and consumer-level iMac® desktop models, the workstation-level Mac Pro® tower, and the MacBook® and MacBook Pro® laptop computers produced by Apple Inc., located in Cupertino, Calif. The computer systems may be, for example based on the PowerPC®, Intel Core Duo, AMD Athlon, AMD Turion processor, AMD Sempron, HP Pavilion PC, HP Compaq PC, and any other processor families. Small systems (e.g. very thin laptop computers) can benefit from the methods described herein. Special purpose computers, which are designed or programmed to perform only one function, or consumer electronic devices, such as a cellular telephone, may also perform the methods described herein.

In the foregoing specification, methods and apparatuses have been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A method to provide a graphical user interface, the method comprising:
   capturing protocol related data generated by a simulation application to design an integrated circuit associated with an interface protocol;
   grouping the protocol-related data according to an abstraction level of the interface protocol; and
   displaying one or more first protocol objects and one or more second protocol objects in a first window on a display device based on the grouping, wherein the first protocol objects represent events associated with a first hierarchical layer of the interface protocol and the one or more second protocol objects represent events associated with a second hierarchical layer of the interface protocol, wherein the one or more first protocol objects and one or more second protocol objects are aligned on the display device along a first axis according to the abstraction level of the interface protocol, and wherein the one or more first protocol objects and the one or more second protocol objects are aligned on the display device along a second axis correlated to a simulation time.

2. The method of claim 1, wherein the protocol objects associated with concurrent protocol events, interleaved protocol events, or both are displayed in different columns along the first axis, and wherein a size of the protocol objects along the second axis is associated with a duration of a protocol event.

3. The method of claim 1, further comprising
   receiving a selection of a first protocol object; and
   selecting one or more second protocol objects related to the first protocol object.

4. A method to provide a graphical user interface, the method comprising:
 capturing protocol related data generated by a simulation application to design an integrated circuit associated with an interface protocol;
 grouping the protocol-related data according to an abstraction level of the interface protocol; and
 displaying one or more first protocol objects and one or more second protocol objects in a first window on a display device based on the protocol related data, wherein the protocol objects are displayed based on the grouping, and wherein the first protocol objects represent events associated with a first hierarchical layer of the interface protocol and the one or more second protocol objects represent events associated with a second hierarchical layer of the interface protocol, wherein the one or more first protocol objects and one or more second protocol objects are aligned on the display device along a first axis according to the abstraction level of the interface protocol, and wherein the one or more first protocol objects and one or more second protocol objects are aligned on the display device along a second axis according to a simulation time.

5. The method of claim 4, wherein the protocol objects associated with concurrent protocol events, interleaved protocol events, or both are displayed in different sub-columns along the first axis.

6. The method of claim 4, wherein different types of protocol objects are associated with different abstraction levels of the protocol.

7. The method of claim 4, wherein a size of the protocol objects along the second axis is associated with a duration of a protocol event.

8. The method of claim 4, further comprising receiving a selection of a first protocol object; and
 selecting one or more second protocol objects related to the first protocol object.

9. The method of claim 4, further comprising receiving a request to annotate a message associated with at least one of the events; displaying a representation of the message in the first window;
 receiving a selection of the representation; and
 displaying the message in a pop-up window in response to the selection of the representation.

10. The method of claim 4, further comprising displaying a first protocol object in the first window; and
 scrolling to a message related to the first protocol object in a second window.

11. The method of claim 4, further comprising correlating in time the displaying the one or more protocol objects in the first window with displaying messages in a second window.

12. A non-transitory machine-readable medium containing instructions that, when accessed by a digital processing system, cause the system to perform operations, comprising:
 capturing protocol related data generated by a simulation application to design an integrated circuit associated with an interface protocol;
 grouping the protocol-related data according to an abstraction level of the interface protocol; and
 displaying one or more first protocol objects and one or more second protocol objects in a first window on a display device based on the protocol related data, wherein the protocol objects are displayed based on the grouping, and wherein the first protocol objects represent events associated with a first hierarchical layer of the interface protocol and the one or more second protocol objects represent events associated with a second hierarchical layer of the interface protocol, wherein the one or more first protocol objects and one or more second protocol objects are aligned on the display device along a first axis according to the abstraction level of the interface protocol, and wherein the one or more first protocol objects and the one or more second protocol objects are aligned on the display device along a second axis correlated to a simulation time.

13. The non-transitory machine readable medium of claim 12, wherein the protocol objects associated with concurrent protocol events, interleaved protocol events, or both are displayed in different sub-columns along the first axis.

14. The non-transitory machine readable medium of claim 12, wherein different types of protocol objects are associated with different abstraction levels of the protocol.

15. The non-transitory machine readable medium of claim 12, wherein a size of the protocol objects along the second axis is associated with a duration of a protocol event.

16. The non-transitory machine readable medium of claim 12, further comprising
 receiving a selection of a first protocol object; and
 selecting one or more second protocol objects related to the first protocol object.

17. The non-transitory machine readable medium of claim 12, further comprising
 receiving a request to annotate a message associated with at least one of the events; displaying a representation of the message in the first window;
 receiving a selection of the representation; and
 displaying the message in a pop-up window in response to the selection of the representation.

18. The non-transitory machine readable medium of claim 12, further comprising
 displaying a first protocol object in the first window; and
 scrolling to a message related to the first protocol object in a second window.

19. The non-transitory machine readable medium of claim 12, further comprising correlating in time the displaying the one or more protocol objects in the first window with displaying messages in a second window.

20. A data processing system to provide a graphical user interface comprising: a memory; and a processor coupled to the memory, wherein the processor is configured to capture protocol related data generated by a simulation application to design an integrated circuit associated with an interface protocol, to group the protocol-related data according to an abstraction level of the interface protocol; and wherein the processor is configured to display one or more first protocol objects and one or more second protocol objects in a first window on a display device based on the protocol related data, wherein the protocol objects are displayed based on the grouping, and wherein the first protocol objects represent events associated with a first hierarchical layer of the interface protocol and the one or more second protocol objects represent events associated with a second hierarchical layer of the interface protocol, wherein the one or more first protocol objects and one or more second protocol objects are aligned on the display device along a first axis according to the abstraction level of the interface protocol, and wherein the one or more first protocol objects and the one or more second protocol objects are aligned on the display device along a second axis correlated to a simulation time.

21. The data processing system of claim 20, wherein the protocol objects associated with concurrent protocol events, interleaved protocol events, or both are displayed in different sub-columns along the first axis.

22. The data processing system of claim 20, wherein different types of protocol objects are associated with different abstraction levels of the protocol.

23. The data processing system of claim 20, wherein a size of the protocol objects along the second axis is associated with a duration of a protocol event.

24. The data processing system of claim 20, wherein the processor is further configured to receive a selection of a first protocol object; and to select one or more second protocol objects related to the first protocol object.

25. The data processing system of claim 20, wherein the processor is further configured to receive a request to annotate a message associated with at least one of the events;
the processor is further configured to display a representation of the message in the first window; the processor is further configured to receive a selection of the representation; and the processor is further configured to display the message in a pop-up window in response to the selection of the representation.

26. The data processing system of claim 20, wherein the processor is further configured to display a first protocol object in the first window; and scroll to a message related to the first protocol object in a second window.

27. The data processing system of claim 20, wherein the processor is further configured to correlate in time the displaying the one or more protocol objects in the first window with displaying messages in a second window.

* * * * *